(12) United States Patent
Kijima

(10) Patent No.: US 7,419,893 B2
(45) Date of Patent: Sep. 2, 2008

(54) METHOD OF MANUFACTURING SEMICONDUCTOR DEVICE HAVING TRIPLE-WELL STRUCTURE AND SEMICONDUCTOR DEVICE FABRICATED

(76) Inventor: Masato Kijima, Ricoh Company, Ltd., 3-6, Nakamagome, 1-chome, Ohta-ku, Tokyo 143-8555 (JP)

( * ) Notice: Subject to any disclaimer, the term of this patent is extended or adjusted under 35 U.S.C. 154(b) by 389 days.

(21) Appl. No.: 11/386,299

(22) Filed: Mar. 21, 2006

(65) Prior Publication Data
US 2006/0216883 A1 Sep. 28, 2006

(30) Foreign Application Priority Data
Mar. 22, 2005 (JP) .............................. 2005-081055

(51) Int. Cl.
*H01L 21/425* (2006.01)
(52) U.S. Cl. ........................ 438/527; 438/530; 438/514; 257/E21.63
(58) Field of Classification Search ................. 438/510, 438/514, 527, 530; 257/E21.63
See application file for complete search history.

(56) References Cited

U.S. PATENT DOCUMENTS 6,309,921 B1 * 10/2001 Ema et al. ................... 438/228

6,475,846 B1 * 11/2002 Marotta et al. .............. 438/201
2002/0038885 A1 * 4/2002 Arai ............................ 257/314

FOREIGN PATENT DOCUMENTS

JP 02-077153 3/1990
JP 09-055483 2/1997

* cited by examiner

*Primary Examiner*—Bradley K Smith
(74) *Attorney, Agent, or Firm*—Cooper & Dunham, LLP

(57) ABSTRACT

This patent specification describes methods for fabricating semiconductor device having a plurality of well structures including a triple-well structure. One example of a method for fabricating semiconductor device includes forming a thermally stable film on a first conductivity type substrate, forming a first resist film having an opening at a position corresponding to a first well forming area on the thermally stable film, removing the thermally stable film selectively by masking with the first resist film so as to make a neutering mask, implanting a second conductivity type impurity into the first well forming area by masking with the neutering mask and the first resist film, removing the first resist film, forming a second conductivity type well by diffusing and activating the second conductivity type impurity implanted into the first well forming area with a heating process, and implanting a first conductivity type impurity into a surface region of the first well forming area by masking with the neutering mask.

14 Claims, 13 Drawing Sheets

METHOD OF MANUFACTURING SEMICONDUCTOR DEVICE HAVING TRIPLE-WELL STRUCTURE AND SEMICONDUCTOR DEVICE FABRICATED

FIELD

This patent specification describes a method of manufacturing a semiconductor device having a triple-well structure at a relatively low cost, and a semiconductor device fabricated by using the method.

BACKGROUND

A recent development of semiconductors contributes to rapid growth of handheld systems such as handheld phones, personal digital assistants and so on. To achieve such equipment in an economical manner, it is highly required to develop high performance and multi-function devices such as high density integrated circuits (ICs) and multiple integration of MOS (Metal oxide semiconductor) transistors and bipolar transistors.

Designing fabrication process of well structures is a key to obtain the high performance and multi-function devices. A twin-well structure has been widely used and a triple-well structure has been introduced for fabricating compact and multi-function devices. The triple-well structure makes it possible to mount circuits working with a minus power supply voltage and contributes a large reduction of noises. Therefore, the triple-well structure is commonly used in LSI (large scale integrated circuit) including analog and digital circuits and memory ICs.

A variety of methods to form the triple-well structure has been proposed. In one method, a P-well is formed in a N-type substrate, a dose of N-type impurities is applied into the P-well by ion implantation and an N-well is formed at another area of the P-well in the same process of forming the N-well. With this process, it is possible to form a triple-well structure without an additional process in comparison with the twin-well process. However, a concentration of the N-well formed at another area of the P-well is different from a concentration of the N-well formed in the P-well.

Namely, the concentrations of the wells have a relationship D1>D2>D3, where D1 is the N-type impurity concentration of the N-well formed at the other area of the P-well, D2 is the P-type impurity concentration of P-well and D3 is the N-type impurity concentration of the N-well formed in the P-well. Thus, by this method, it is not possible to form the N-wells with the equivalent N-type impurity concentration. Due to the different N-type impurity concentration of the N-well in the P-well, transistors in the N-wells have different electrical characteristics from each other. As a result, it is difficult and complicated to design circuits using the transistors having different electrical characteristics.

Another proposed method is to use two masks having openings at different positions and form N-wells at separate processes using the masks. However, a number of masks increases with an increase of a number of wells. Consequently a fabrication cost is becoming highly proportional to the number of masks and processes.

As another method, it is proposed to introduce high energy ion implantation method. FIG. 1 illustrates a cross-sectional view of the semiconductor having triple-well structure formed by this method. In this method, a P-well 232 making a frame border is formed in a substrate 230. Then a P-type impurity is implanted with high energy ion in a deep portion in the substrate 230. Then, diffusion and activation processes are performed such that a buried P-well 236 is formed in contact with a bottom of P-well 232 as shown in FIG. 1.

Then, an N-type impurity is implanted at a surface of an area which is surrounded with the P-well 232 and the buried P-well 236. At the same time, a N-type impurity is also implanted at another area which is not surrounded with the P-well 232 and the buried P-well 236. Then, diffusion and activation process are performed such that N-wells 238 and 240 are formed.

Because the N-well 238 is surrounded with the P-well 232 and the buried P-well 236, the N-well 238 is electrically disconnected to the substrate 230 and the N-wells 240. Moreover, the N-wells 238 and 240 are formed at the same process and with the same dosage of N-type impurity. As a result, N-wells having same impurity concentration are formed inside and outside of the area which is surrounded with the P-well 232 and the buried P-well 236.

The high energy ion implantation method requires one more photo-lithography process to twin-well process. Adding one process, it is possible to form a triple-well which includes the deep P-well (DPW) consisting of the P-well 232 and the buried P-well 236 and the N-well 238 surrounded with the DPW. Moreover, it is possible that each transistor formed in each well has a same electrical characteristic because the wells are formed to have the same impurity concentration. Therefore, it becomes easy to perform a circuit design with a simple transistor lineup to be used.

However, the high energy ion implantation method requires an expensive high energy ion implantation apparatus. Therefore, it is desired to form a triple-well structure associated with wells having uniform impurity concentration inside and outside of the triple-well structure by a simple and a high cost performance fabrication process without using high energy ion implantation equipment.

SUMMARY

This patent specification describes novel methods for fabricating semiconductor device having a plurality of well structures including a triple-well structure. In one example, a method for fabricating semiconductor device includes forming a thermally stable film on a first conductivity type substrate, forming a first resist film having an opening at a position corresponding to a first well forming area on the thermally stable film, removing the thermally stable film selectively by masking with the first resist film so as to make a neutering mask, implanting a second conductivity type impurity into the first well forming area by masking with the neutering mask and the first resist film, removing the first resist film, forming a second conductivity type well by diffusing and activating the second conductivity type impurity implanted into the first well forming area with a heating process, implanting a first conductivity type impurity into a surface region of the first well forming area by masking with the neutering mask.

This patent specification further describes a novel semiconductor device which includes a substrate having a first conductivity type, a first well having a second conductivity type formed on the substrate, a second well having the first conductivity type formed in the first well and a third well having the first conductivity type formed in an area other than the first well. The first well is formed by a process including the above described process.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
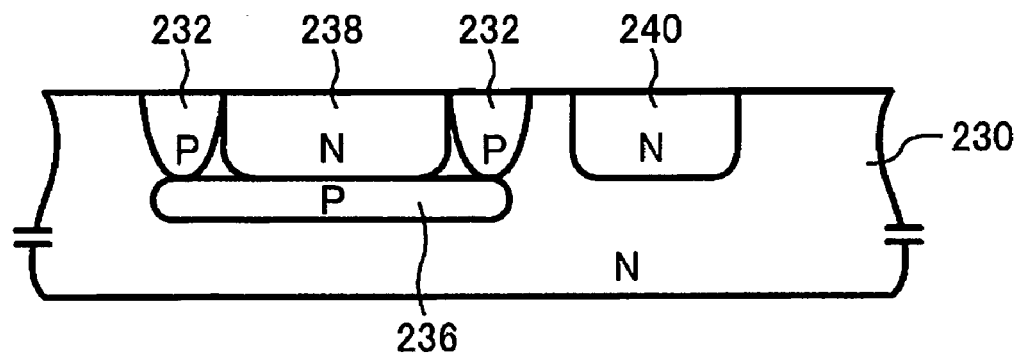
FIG. 1 illustrates a cross-sectional view of a semiconductor device having a triple-well structure formed by a background method using buried P-well.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to the drawings, wherein like reference numerals designate identical or corresponding parts throughout the several views, particularly to FIGS. 3A to 3G, a method for manufacturing semiconductor device having triple-well structure is described.

Figure 2:
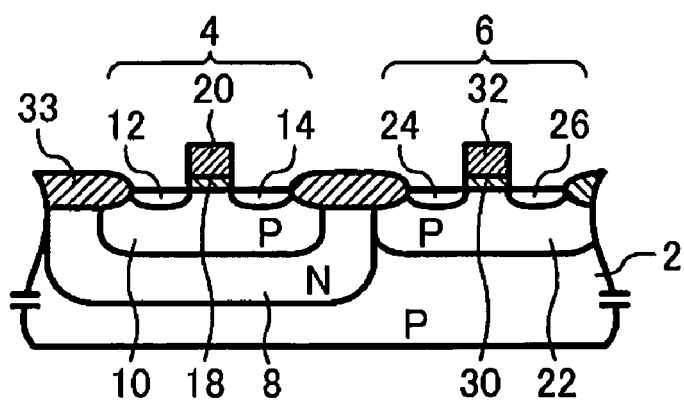
FIG. 2 illustrates a cross section of a semiconductor device having triple-well structure according to an exemplary embodiment.

FIG. 2 illustrates a cross section of a semiconductor device having triple-well structure. The semiconductor device includes a N-channel MOS transistor 4 and another type of N-channel MOS transistor 6 formed on a substrate 2. An N-channel MOS transistor is referred to as an N-ch transistor.

The N-ch transistor 4 is formed inside an IPW 10 (inter P-well), i.e., second well, which is formed in a DNW 8 (deep N-well), i.e., first well. The N-ch transistor 4 includes a source 12, a drain 14 and a gate 20. The source 12 and the drain 14 are formed in the IPW 10. The gate 20 is formed over a channel area which is between the source 12 and the drain 14 via a gate oxide 18.

The N-ch transistor 6 includes a source 24, a drain 26 and a gate 32. The source 24 and the drain 26 are formed in a P-well (third well) 22. The gate 32 is formed over a channel area which is between the source 24 and the drain 26 via a gate oxide 30. The N-ch transistors 4 and 6 are electrically separated by the LOCOS (local oxidation of silicon) oxide 33.

Phosphorus, for example, is implanted as a N-type impurity into the DNW 8. Boron, for example, is implanted as a P-type impurity into the IPW 10 and the P-well 22. To form the IPW 10 in the DNW 8, the boron is implanted after forming the DNW 8 to neuter the phosphorus implanted to form the DNW 8. Further, the boron is implanted to the IPW 10 at the same time to form the P-well 22.

Therefore, a boron concentration of the surface of the IPW 10 is substantially equal to a boron concentration of the surface of the P-well 22. The circuit design can be easy because it is possible to handle both N-ch transistors 4 and 6 with a single device because they have same electrical characteristics-during the circuit design.

FIGS. 3A to 3G illustrate a semiconductor device in cross-section at each process according to an exemplary embodiment. Each process will be described in order. The semiconductor device includes a first well forming area 35, a second well forming area 37 and a third well forming area 39 on a semiconductor substrate 2. The first well forming area 35 is an area to form the DNW 8 therein. The second well forming area 37 is an area located in the DNW 8 to form the IPW 10 therein. The third well forming area 39 is an area located at another area to the DNW 8 to form the P-well 22 therein.

Figure 3A:
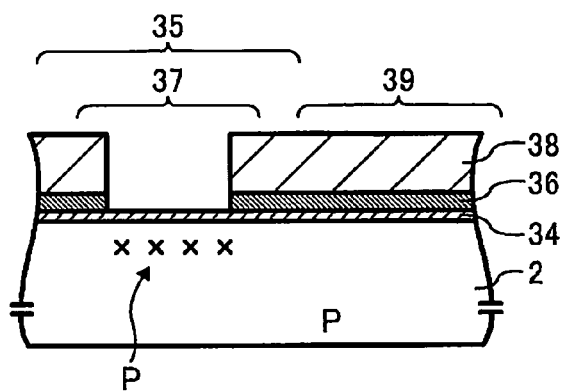
FIGS. 3A to 3G illustrate a semiconductor device in cross-section at each process according to the exemplary embodiment.

In step A of FIG. 3A, a silicon oxide film 34 is formed on the P-type substrate 2 and a silicon nitride film is formed on the silicon oxide film 34. A first resist film 38 is formed on the silicon nitride film using photo-lithography process. The first resist film 38 includes an opening at a position corresponding to the first well forming areas 35. The silicon nitride film at the first well forming area 35 is selectively removed by masking with the first resist film 38 so as to make a neutering mask 36 which is made of the silicon nitride film.

Figure 3B:
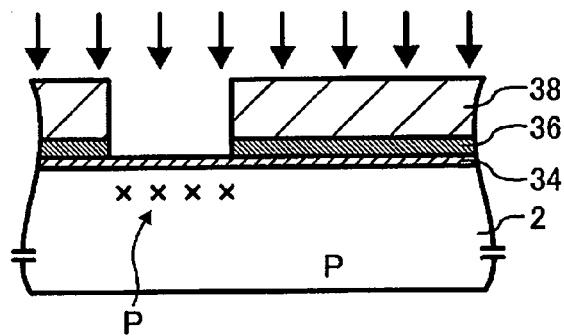

In step B of FIG. 3B, the phosphorus which is a N-type impurity is implanted into the first well forming area 35 by masking with the neutering mask 36 and the first resist film 38. In this implantation process, the dose energy is 60 KeV and the dose density is $1.0 \times 10^{13}$ cm$^{-2}$.

Figure 3C:
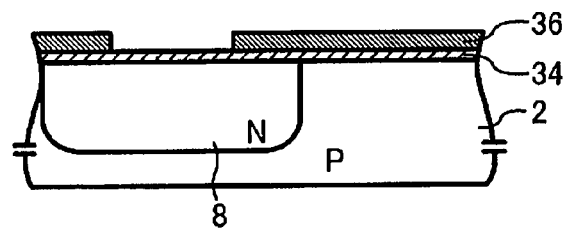

In step C of FIG. 3C, the first resist film 38 is removed. Having the neutering mask 36, heating process is performed to form the DNW 8 in the first well forming areas 35. In this heating process, the temperature is 1180° C. and the heating process time is 5 hrs.

Figure 3D:
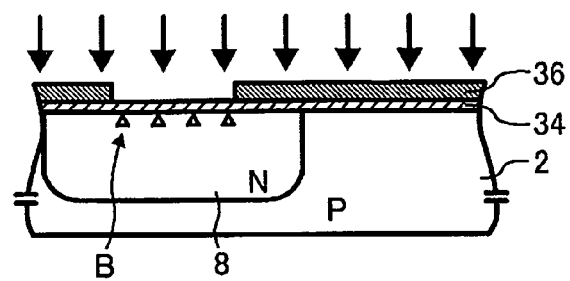

In step D of FIG. 3D, the boron which is a P-type impurity is implanted into the DNW 8 by masking with the neutering mask 36 to form a neutered area. The boron dose density is set to make a density at the surface region of the second well forming area 37 substantially equal to a density of the substrate 2 by neutering the phosphorus at the surface region of the second well forming area 37. In this implantation process, the dose energy is 30 KeV and the dose density is $5.7 \times 10^{12}$ cm$^{-2}$.

Figure 3E:
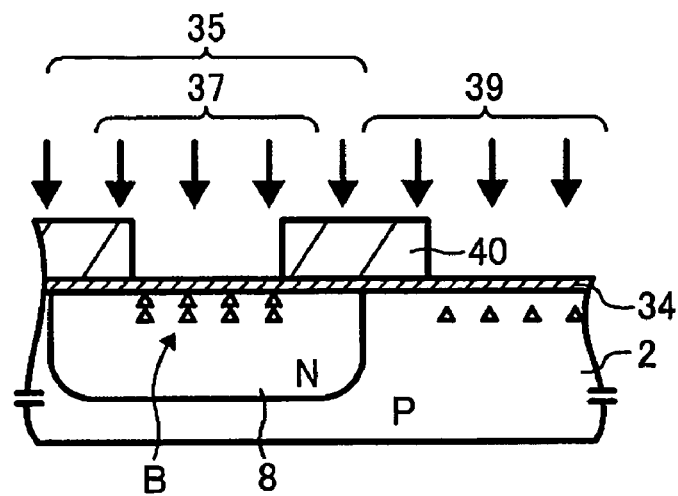

In step E of FIG. 3E, the neutering mask 36 is removed. A second resist 40 having openings at a position corresponding to the second well forming area 37 in the neutered area and to the third well forming area 39 which locates in an area other than the DNW 8 is formed on the silicon oxide 34. The boron is implanted into the second well forming area 37 and the third well forming area 39 by masking with the second resist film 40. In this implantation process, the dose energy is 30 KeV and the dose density is $1.2 \times 10^{12}$ cm$^{-2}$.

Figure 3F:
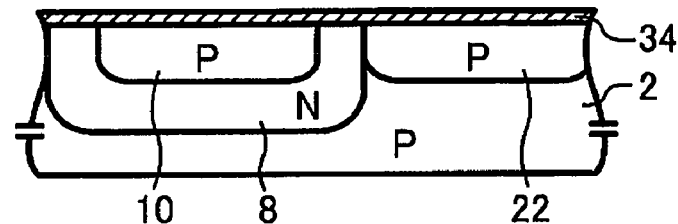

In step F of FIG. 3F, the silicon oxide 34 is removed. Then, a heating process is performed to form the IPW 10 in the DNW 8 and the P-well 22 in the third well forming areas 39. In this heating process, the temperature is 1150° C. and the heating process time is 2 hrs.

Figure 3G:
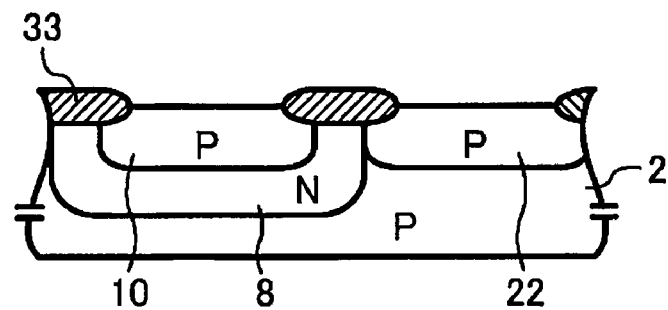

In step G of FIG. 3G, the silicon oxide 34 is removed. Then, the LOCOS oxides 33 are formed at predetermined areas by well known LOCOS forming process. After that, gate oxides 18 and 30, gate electrodes 20 and 32, sources and drains 14 and 26 are formed. As a result, N-ch transistors are formed in the substrate 2 as shown in FIG. 2.

The IPW 10 can be used as a triple-well because the IPW 10 is electrically separated from the substrate 2 by the DNW 8. Further, this process contributes a large cost reduction because of no usage of the high energy implantation to form the triple-well structure.

According to this exemplary embodiment, at the step D of FIG. 3D, the boron is implanted into the second well forming area 37 to make the P-type impurity density at the surface region of the second well forming area 37 substantially equal to the density of the substrate 2. Then, at the step E of FIG. 3E, the boron is implanted to both the second well forming area 37 and the third well forming areas 39 at a process such that the IPW 10 and P-well 22 which have the substantially equal density with the P-type impurity density at the surface region can be formed inside and outside of the DNW 8. Therefore, it is possible to handle both N-ch transistors 4 and 6 as a single sort of device during the circuit design. Consequently, the design activity can be simple and easy.

Further, as shown in the step D of FIG. 3D, the boron implantation to the second well forming area 37 is performed by masking with the neutering mask 36 formed by the first resist film 38. The first resist film 38 is the implantation mask used at the step A of FIG. 3A for forming the DNW 8. As a result, an additional photo-lithography process using a neutering mask can be eliminated with this process flow.

Figure 4:
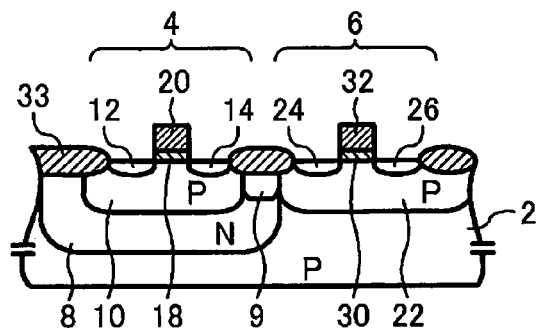
FIG. 4 illustrates a cross-sectional view of another exemplary embodiment of a semiconductor device.

FIG. 4 illustrates a cross-sectional view of another exemplary embodiment of a semiconductor device including a N-well (sixth well) 9 which locates in another area than the IPW 10 and the P-well 22. The N-well 9 is formed at an area between the IPW 10 formed in the DNW 8 and the P-well 22. With this configuration, the transistor 6 in the P-well 22 can be located more closely to the transistor 4 in the P-well 10 because the P-type IPW 10 is electrically separated from the P-well 22 by the N-well 9. Namely, more transistors can be placed on the substrate 2 and the high density semiconductor devices can be obtained.

Figure 5:
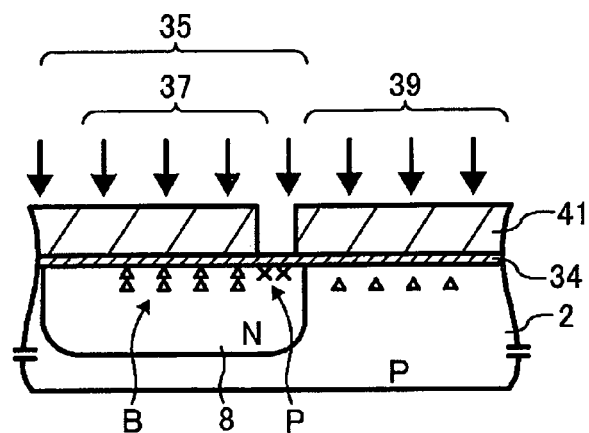
FIG. 5 illustrates a cross-sectional view of a optional process of FIG. 4.

The semiconductor device shown in FIG. 4 can be formed adding a process step E2 of FIG. 5 to the step E of FIG. 3E. In the step E2 of FIG. 5, a fourth resist film 41 for forming N-wells is formed on the silicon oxide film 34. The fourth resist film 41 includes openings at a position corresponding to a separation area between the second and third well forming areas 37 and 39. After that, the phosphorus which is a N-type impurity is implanted into the separation area between the second and third well forming areas 37 and 39 by masking with the resist film 41. The N-well 9 is formed at a process of forming the IPW 10 and P-well after the following heating process at the Step F is performed.

In the process step E2 of FIG. 5, the phosphorus is implanted after the boron implantation into the second and third well forming areas 37 and 39. It may be possible to L implant the phosphorus before the boron implantation into the second and third well forming areas 37 and 39. Further, in the process step E2 of FIG. 5, the N-well 9 is formed in the area located between the IPW 10 and the P-well 22. It may be possible to form another area. (not shown)

Figure 6:
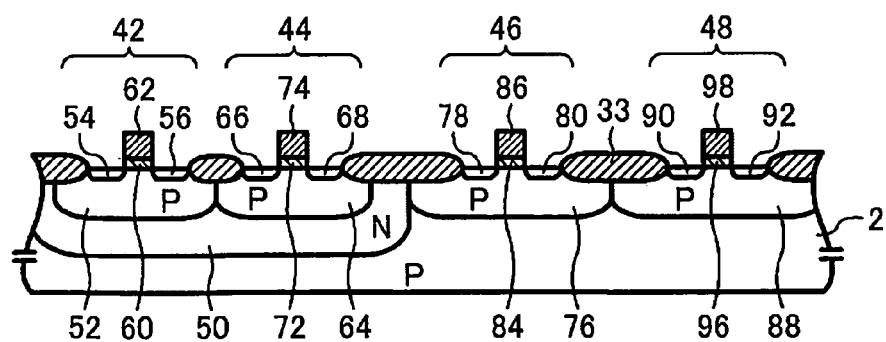
FIG. 6 illustrates a cross-sectional view of another exemplary embodiment of a semiconductor device.

FIG. 6 illustrates a cross-sectional drawing of another exemplary embodiment of a semiconductor device. The semiconductor includes two N-channel MOS transistors 42 and 44 formed in the DNW (first well) 50 on the P-type substrate 2. Further, the semiconductor includes two N-channel MOS transistors 46 and 48 formed in the area other than the DNW (first well) 50. The N-ch transistors 42, 43, 46 and 48 are electrically separated by the LOCOS oxide 33.

The N-ch transistor 42 is formed inside an IPW (second well) 52 which is formed in a DNW 50. The N-ch transistor 42 includes a source 54, a drain 56 and a gate 62. The source 54 and the drain 56 are formed in an IPW 52. The gate 62 is formed over a channel area which is between the source 54 and the drain 56 via a gate oxide 60.

The N-ch transistor 44 is formed inside an IPW (fourth well) 64 which is formed in an area other than the IPW 52 in the DNW 50. The N-ch transistor 42 includes a source 66, a drain 68 and a gate 74. The source 66 and the drain 68 are formed in the IPW 64. The gate 74 is formed over a channel area which is between the source 66 and the drain 68 via a gate oxide 74.

The N-ch transistor 46 is formed inside an P-well (third well) 76 which is formed in an area other than the DNW 50. The N-ch transistor 46 includes a source 78, a drain 80 and a gate 86. The source 78 and the drain 80 are formed in a P-well 76. The gate 86 is formed over a channel area which is between the source 78 and the drain 80 via a gate oxide 84.

The N-ch transistor 48 is formed inside an P-well (fifth well) 88 which is formed in an area other than the DNW 50 and the P-well 76. The N-ch transistor 48 includes a source 90, a drain 92 and a gate 98. The source 90 and the drain 92 are formed in a P-well 88. The gate 98 is formed over a channel area which is between the source 90 and the drain 92 via a gate oxide 96.

Phosphorus, for example, is implanted as a N-type impurity into the DNW 50. Boron, for example, is implanted as a P-type impurity into the IPW 52 and 64 and the P-well 78 and 88.

According to this exemplary embodiment, the boron is implanted into the IPW 52 in the DNW 50 to neuter the phosphorus at a surface of the IPW 52 so as to make the boron density at the surface region of the IPW 52 substantially equal to the density of the P-well 76. The boron is implanted to both the IPW 52 and the P-well 76 at a process such that the IPW 52 and P-well 76 which have the substantially equal density to the boron density at the surface region each other can be formed.

Similarly, the boron is implanted into the IPW 64 in the DNW 50 to neuter the phosphorus at a surface of the IPW 64 so as to make the boron density at the surface region of the IPW 64 substantially equal to the density of the P-well 88. The boron is implanted to both the IPW 64 and the P-well 88 at a process such that the IPW 64 and P-well 88 which have the substantially equal density to the boron density at the surface region each other can be formed. A boron density of the IPW 52 and the P-well 76 is different from a boron density of the IPW 64 and the P-well 88.

It is possible to handle that the N-ch transistors 42 in the IPW 52 which have the substantially equal boron density to P-well 76 is a single sort of device as the N-ch transistors 46 in the P-well 76 during the circuit design. Similarly, it is possible to handle that the N-ch transistors 44 in the IPW 64 which have the substantially equal boron density to P-well 88 is the single sort of device as the N-ch transistors 48 in the P-well 88 during the circuit design. Therefore, the design activity can be made simple and easy.

FIGS. 7A to 7H illustrate a semiconductor device in cross-section at each process according to an exemplary embodiment. Each process will be described in order. The semiconductor device includes a first well forming area 35, a second well forming area 104, a third well forming area 106, a fourth well forming area 110 and a fifth well forming area 112 on a semiconductor substrate 2. The first well forming area 35 is an area to form the DNW 50 therein. The second well forming area 104 and the fourth well forming area 110 are areas located in the first well forming area 35 to form the IPWs 52 and 64 respectively therein.

The third well forming area 106 and the fifth well forming area 112 are areas located at another area to the DNW 50 to form the P-wells 76 and 88 therein. The fourth well forming area 110 is an area located in the DNW 50 to form the P-well 64 therein. The fifth well forming area 112 is an area located at another area to the DNW 50 to form the P-well 88 therein.

Figure 7A:
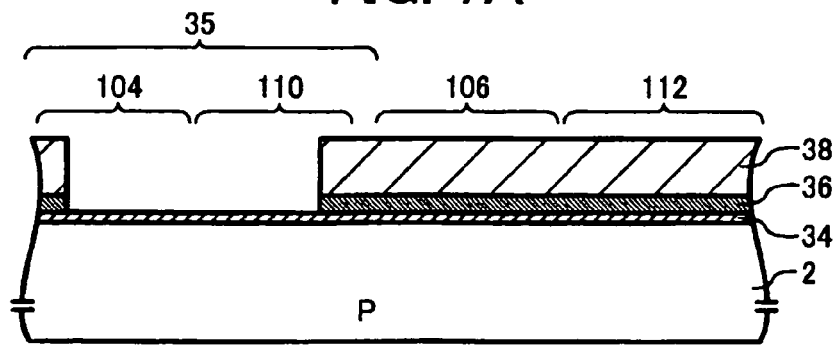
FIGS. 7A to 7H illustrate a semiconductor device in cross-section at each process according to an exemplary embodiment of FIG. 6.

In step A of FIG. 7A, a silicon oxide film 34 is formed on the P-type substrate 2 and a silicon nitride film 36 is formed as a thermally stable film layer on the silicon oxide film 34. A first resist film 38 is formed on the silicon nitride film 36 using photo-lithography process. The first resist film 38 includes an opening at a position corresponding to the first well forming areas 35. The silicon nitride film 36 at the first well forming area 35 is selectively removed by masking with the first resist film 38 so as to make a neutering mask which is made of the silicon nitride film 36.

Figure 7B:
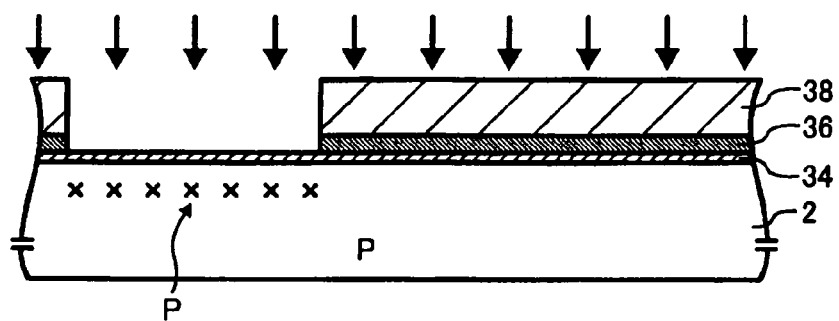

In step B of FIG. 7B, the phosphorus which is a N-type impurity is implanted into the first well forming area 35 by masking with the neutering mask 36 and the first resist film 38. In this implantation process, the dose energy is 60 KeV and the dose density is $1.0 \times 10^{13}$ cm$^{-2}$.

Figure 7C:
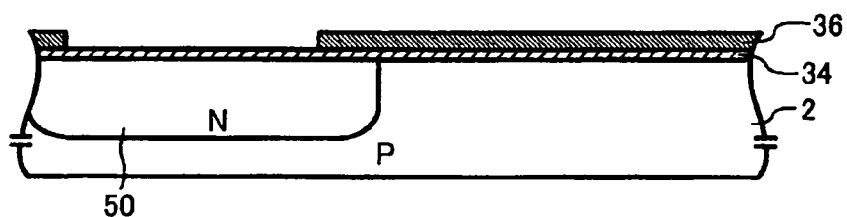

In step C of FIG. 7C, the first resist film 38 is removed. Having the neutering mask 36, heating process is performed to form the DNW 50 in the first well forming areas 35. In this heating process, the temperature is 1180° C. and the heating process time is 5 hrs.

Figure 7D:
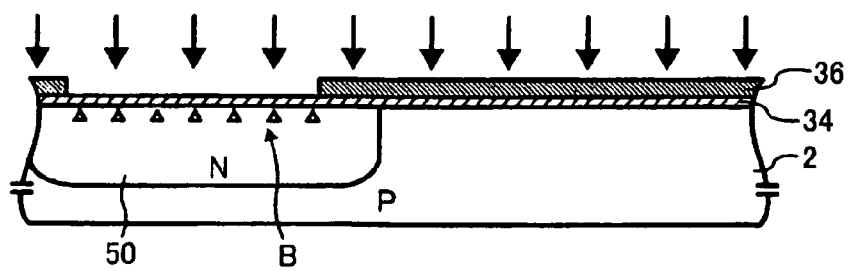

In step D of FIG. 7D, the boron which is a P-type impurity is implanted into the first well forming area 35 by masking with the neutering mask 36. The boron dose density is set to make substantially equal to a density of the substrate 2 by neutering the phosphorus density at the surface region of the second and fourth well forming areas 104 and 110. In this implantation process, the dose energy is 30 KeV and the dose density is $5.7 \times 10^{12}$ cm$^{-2}$. The area in the DNW 50 where the boron is implanted is called a neutered area because the N-type impurity is neutered by the P-type impurity.

Figure 7E:
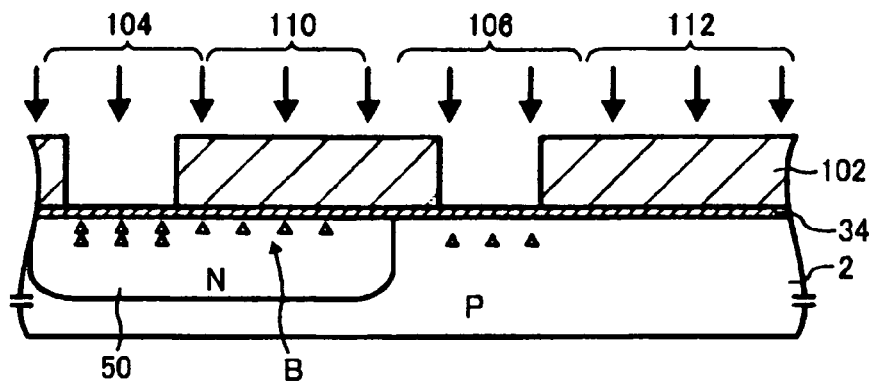

In step E of FIG. 7E, the neutering mask 36 is removed. A second resist film 102 having openings at positions corresponding to the second and third well forming area 104 and 106 is formed on the silicon oxide 34. The boron is implanted into the second and third well forming area 104 and 106 by masking with the second resist film 102. The second well forming area 104 is the neutered area of the step D of FIG. 7D. The third well forming area 106 is the other area to the DNW 50. In this implantation process, the dose energy is 30 KeV and the dose density is $1.2 \times 10^{12}$ cm$^{-2}$.

Figure 7F:
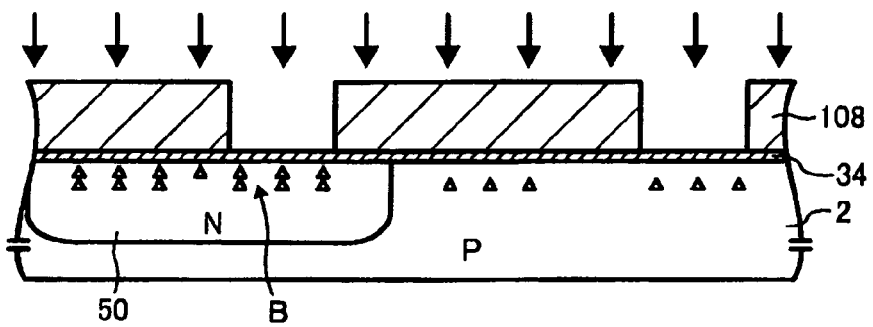

In step E1 of FIG. 7F, the second resist film 102 is removed. A third resist film 108 having openings at positions corresponding to the fourth well forming area 110 and the fifth well forming area 112 is formed on the silicon oxide 34. The boron is implanted as a P-type impurity into the fourth well forming area 110 and the fifth well forming area 112 by masking with the third resist film 108. The fourth well forming area 110 is the neutered area formed in the step D and is located at an area other than the second well forming area 104. The fifth well forming area 112 is the other area to the DNW 50 and the third well forming area 106. In this implantation process, the dose energy is 30 KeV and the dose density is $1.2 \times 10^{12}$ cm$^{-2}$.

Figure 7G:
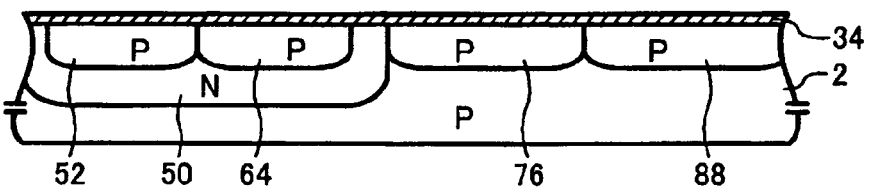

In step G of FIG. 7G, the third resist film 108 is removed and then heating process is performed. The IPW 52 is formed in the second well forming areas 104 of the DNW 50. The IPW 64 is formed in the fourth well forming areas 110 of the DNW 50. The P-wells 76 and 88 are formed in the third well forming areas 106 and 112 which are located at an area other than the DNW 50. In this heating process, the temperature is 1150° C. and the heating process time is 2 hrs.

Figure 7H:
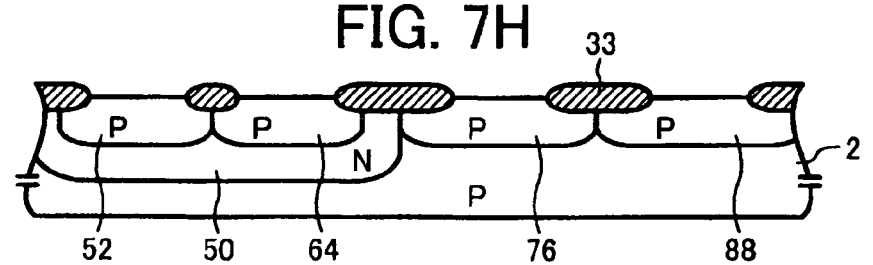

In step H of FIG. 7H, the silicon oxide 34 is removed. Then, the LOCOS oxides 33 are formed at predetermined areas by well known LOCOS forming process. After that, gate oxides 60, 72, 84 and 96 and gate electrodes 62, 74, 86 and 98, sources 54, 66, 78 and 90 and drains 56, 68, 80 and 92 are formed. As a result, N-ch transistors 42, 44, 46 and 48 are formed in the substrate 2 as shown in FIG. 6.

According to this exemplary embodiment, the boron is implanted into the neutered area of the DNW 50 so as to make the P-type impurity density at the surface region of the DNW 50 substantially equal to the density of the substrate 2. The IPW 52 and the P-well 76 are formed at a boron implantation process so that the IPW 52 and the P-well 76 have the substantially equal density to the P-type impurity density at the surface region. Similarly, the IPW 64 and the P-well 88 are formed at another boron implantation process so that the IPW 64 and the P-well 88 have the substantially equal density to the P-type impurity density at the surface regions.

The two sets of P-wells (i.e., 52 and 76, 64 and 88) can be formed inside and outside of the DNW 50. It is possible to handle both N-ch transistors 42 and 46 formed in the IPW 52 and the P-well 76 as a single sort of device during the circuit design based on the above reason. Similarly, it is possible to handle both N-ch transistors 44 and 48 formed in the IPW 64 and the P-well 88 as a single sort of device during the circuit design. Therefore, the design activity can be easy with the transistors obtained by the exemplary embodiment.

If an existing process flow is used to manufacture the semiconductor device having the structure shown in FIG. 6, four photo-lithography processes with four masks are utilized when two kinds of well sets which have substantially equal density respectively are formed inside and outside of the DNW 50. However, according to this exemplary embodiment, the boron implantation can be performed by three masks, i.e., the neutering mask 36, the second resist film 102 and the third resist film 108. The neutering mask 36 is formed by the first resist film 38 which is for forming the DNW 50. Namely, a number of the photo-lithography processes for the boron implantation is two. Consequently, the number of photo-lithography processes can be reduced from four to two.

Figure 8:
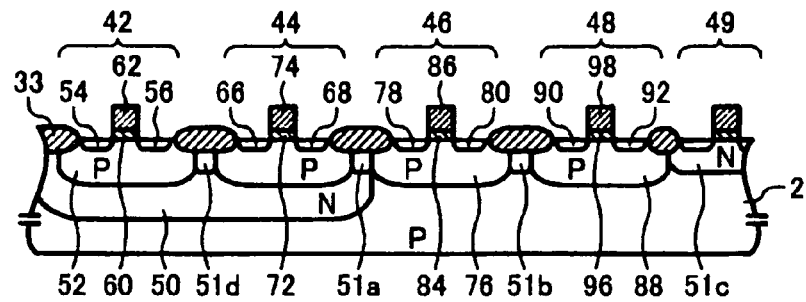
FIG. 8 illustrates a cross-sectional view of another exemplary embodiment of a semiconductor device.

FIG. 8 illustrates a cross-sectional view of another exemplary embodiment of a semiconductor device. An N-well 51a is formed between the IPW 64 and the P-well 76. An N-well 51b is formed between the P-wells 76 and 88. An N-well 51c is formed in an area other than the DNW 50 and the P-wells 76 and 88. Then, gate oxides, gate electrodes, sources and drains are formed therein to form P-channel MOS transistors. The P-channel MOS transistor is referred to as an P-ch transistor.

Further, a N-well 51*d* is formed between the IPWs 52 and 64. In this case, a distance between the IPWs 52 and 64 may be longer in comparison with the distance of the case in FIG. 6. The N-wells 51*a*, 51*b*, 51*c* and 51*d* can be formed by the opening pattern change of the second resist film 102 and third resist film 108 at the process step E and F of FIGS. 7E and 7F respectively.

Because of the existence of the N-wells 51*a* and 51*b*, the adjacent wells (i.e., the IPW 64 and the P-well 76, P-wells 76 and 88, the IPWs 52 and 64) are electrically separated from each other. The distance between transistors 44 and 46 and the distance between transistors 46 and 48 can be small so that the high density semiconductor device can be obtained. Further, the IPW 52 is electrically separated from the IPW 64 because of the N-well 51*d* located between IPWs 52 and 64. More N-wells may be placed at areas other than the IPWs 51*a*, 51*b* and 51*c*.

Figure 9:
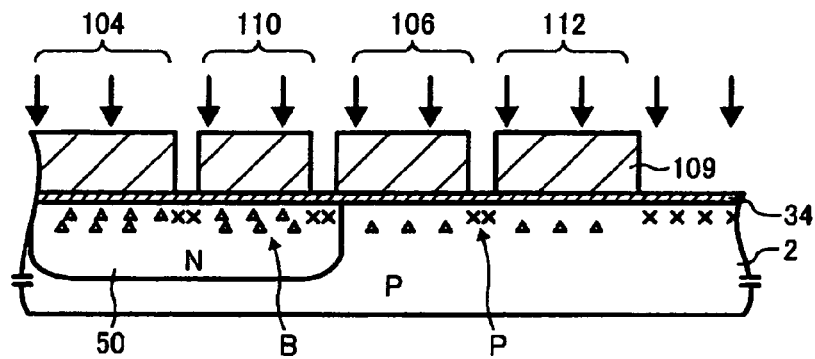
FIG. 9 illustrates a cross-sectional view of an optional process to FIG. 7.

The semiconductor device shown in FIG. 8 can be formed adding a process step E2 of FIG. 9 to the step E of FIG. 7E. The distance between the second and forth well forming area 104 and 110 is longer in comparison with the distance taken in the case of FIGS. 7A to 7H. The patterns of the second and the third resist films 102 and 108 are changed to match the well forming areas.

In the step E2 of FIG. 9, a fourth resist film 109 for forming N-wells is formed on the silicon oxide film 34. The fourth resist film 109 includes openings at positions corresponding to the separation areas (i.e., area between the fourth and third well forming area 110 and 106, area between the third and fifth well forming area 106 and 112 and areas which are located other than the above mentioned separation areas and the P-well.

After that, the phosphorus is implanted into the well forming areas by masking with the fourth resist film 109. The N-well 51*a*, 51*b* and 51*c* are formed at a process of forming the IPWs 52 and 64 and the P-wells 76 and 88 after the following heating process at the Step G of FIG. 7G is performed.

In this process, the phosphorus to form the N-wells 51*a*, 51*b* and 51*c* is implanted after the boron implantation to form the IPWs 52 and 64 and P-wells 76 and 88. It may be possible to implant the phosphorus before the boron implantation to form the IPWs 52 and 64 and P-wells 76 and 88. Further, any order of the phosphorus implantation performed after formation of the DNW 50 and the two boron implantation may be possible.

Figure 10:
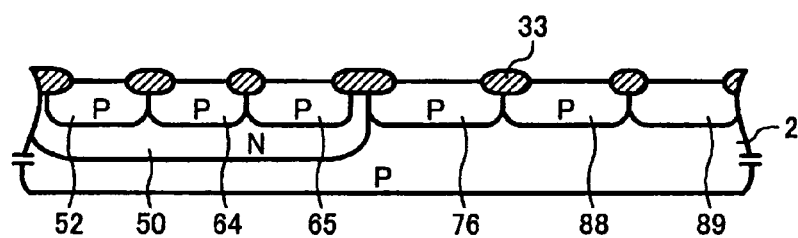
FIG. 10 illustrates a cross-sectional view of another exemplary embodiment of a semiconductor device.

FIG. 10 illustrates a cross-sectional view of another exemplary embodiment of a semiconductor device. The semiconductor device includes three kind of IPWs 52, 64 and 65 having different impurity densities in the DNW 50 and includes P-wells 76, 88 and 89 at areas other than the DNW 50.

The boron impurity densities at the surface region of regarding each of the three combinations (i.e., the IPW and the P-well 52 and 76, 64 and 88 and 65 and 89) are substantially equal boron density at the surface region to each other. The semiconductor device shown in FIG. 10 can be formed adding a process step E1 of FIG. 11 after the processes of FIGS. 7E and 7F. The positions of the second well forming area 104 and the fourth well forming area 110 are different from the positions of the case of FIG. 7E.

A resist film 108*a* for forming wells is formed on the silicon oxide 34. The resist film 108*a* includes openings at positions corresponding to areas other than the well forming areas in the neutered areas such as the second well forming area 104 and the fourth well forming area 110 and other than the DNW 50, the third well forming area 106 and the fifth well forming area 112. The boron is implanted by masking with the resist film 108*a*. The IPW 65 and the P-well 89 are formed at a process of forming the IPWs 52 and 64 and P-wells 76 and 88 after the following heating process is performed.

Figure 11:
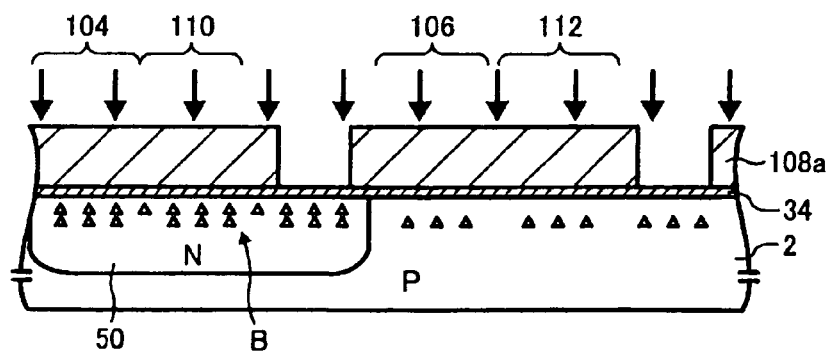
FIG. 11 illustrates a cross-sectional view of another optional process to FIG. 7.

The process step E1 of FIG. 11 can be performed more than twice if more number of the combinations of the IPW and the P-well which have substantially equal surface densities is requested. Any combinations of the process step E1 of FIG. 11 and the process step E2 of FIG. 9 are possible.

Figure 12:
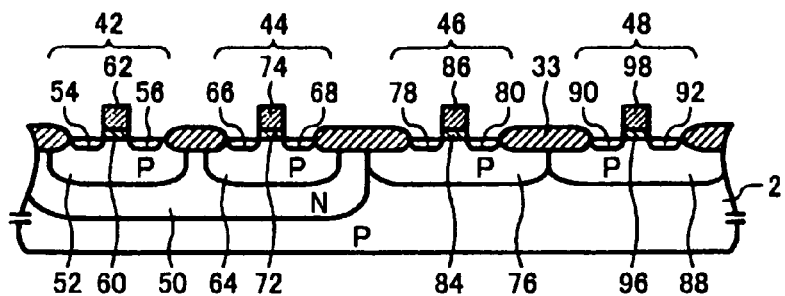
FIG. 12 illustrates a cross-sectional view of another exemplary embodiment of a semiconductor device.

FIG. 12 illustrates a cross-sectional view of another exemplary embodiment of a semiconductor device. The semiconductor device includes a separation area between IPWs 52 and 64 which are electrically separated with the DNW 50.

FIGS. 13A to 13G illustrate a semiconductor device in cross-section at each process according to another exemplary embodiment of FIG. 12. Each process will be described in order. The semiconductor device includes a first well forming area 35, a second well forming area 104, a third well forming area 106, a fourth well forming area 110 and a fifth well forming area 112 on a semiconductor substrate 2. The first well forming area 35 is an area to form the DNW 50 therein. The second well forming area 104 and the fourth well forming area 110 are areas to form the IPWs 52 and 64 respectively therein. The third well forming area 106 and the fifth well forming area 112 are areas to form P-wells 76 and 88 respectively therein and located at areas other than the DNW 50.

Figure 13A:
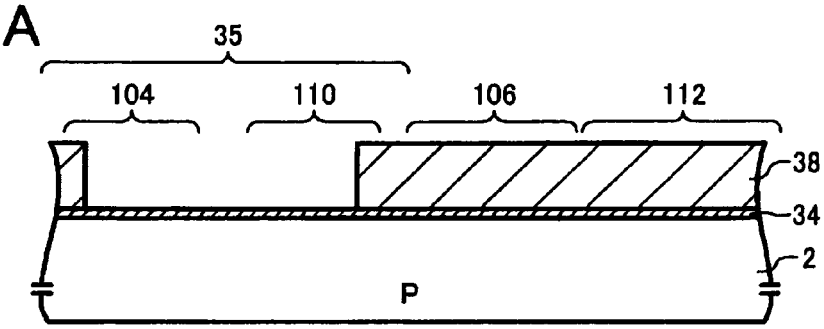
FIGS. 13A to 13G illustrate a semiconductor device in cross-section at each process according to another exemplary embodiment.

In step A of FIG. 13A, a first resist film 38 having an openings at a position corresponding to the first well forming areas 35 is formed.

Figure 13B:
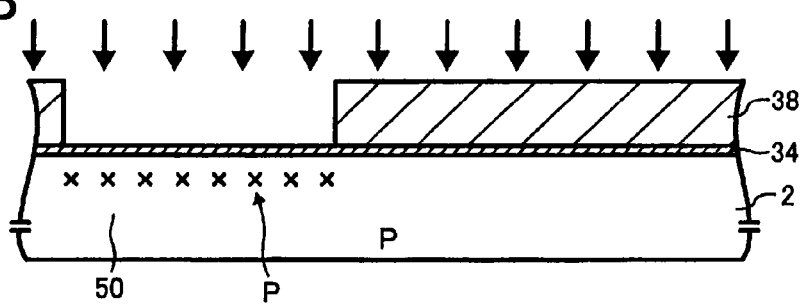

In step B of FIG. 13B, the phosphorus which is a N-type impurity is implanted into the first well forming area 35 by masking with the first resist film 38. In this implantation process, the dose energy is 60 KeV and the dose density is $1.0 \times 10^{13}$ cm$^{-2}$.

Figure 13C:
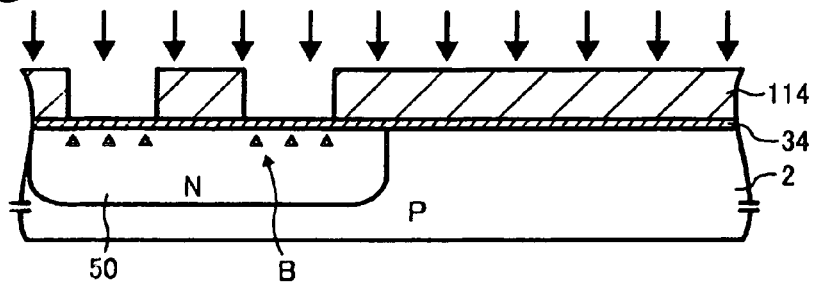

In step C of FIG. 13C, the first resist film 38 is removed. Heating process is performed to form the DNW 50 in the first well forming areas 35. In this heating process, the temperature is 1180° C. and the heating process time is 5 hrs.

A neutering mask 114 having openings at positions corresponding to the second well forming area 104 and the fourth well forming area 110 is formed. The boron which is a P-type impurity is implanted into the second well forming area 104 and the fourth well forming area 110 by masking with the neutering mask 114. The boron dose density is set to make the boron density of the surface region of the second and fourth well forming 104 and 110 substantially equal to a density of the substrate 2 by neutering the phosphorus density at the surface region of the well forming areas. In this implantation process, the dose energy is 30 KeV and the dose density is $5.7 \times 10^{12}$ cm$^{-2}$.

Figure 13D:
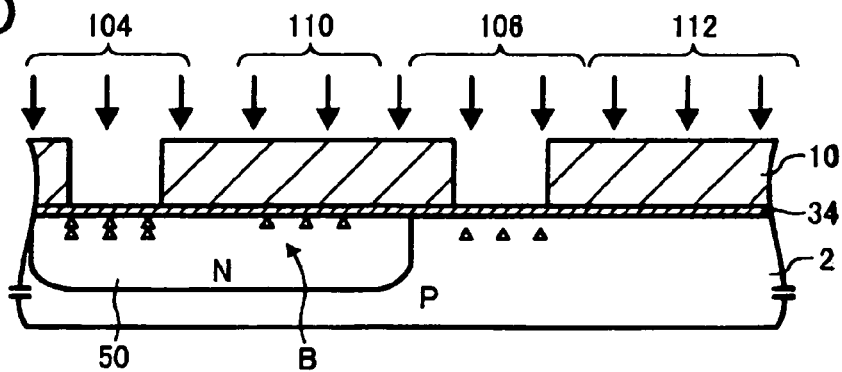

In step D of FIG. 13D, a second resist 102 having openings at positions corresponding to the second well forming area 104 and the third well forming area 106 is formed. The boron is implanted into the second well forming area 104 and the third well forming area 106 by masking with the second resist film 102. In this implantation process, the dose energy is 30 KeV and the dose density is $1.2 \times 10^{12}$ cm$^{-2}$.

Figure 13E:
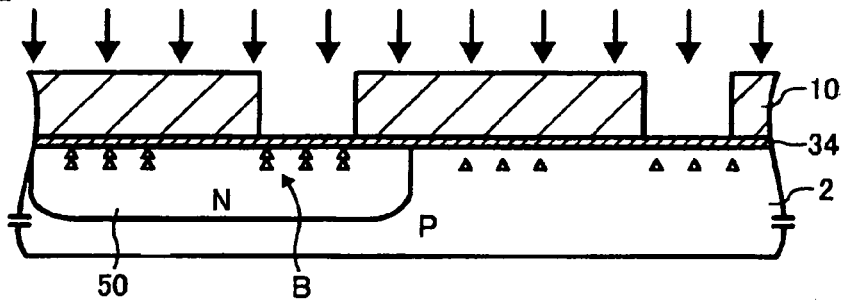

In step E of FIG. 13E, the second resist film 102 is removed. A third resist 108 having openings at positions corresponding to the fourth well forming area 110 and the fifth well forming area 112 is formed. The boron is implanted into the fourth well forming area 110 and the fifth well forming area 112 by masking with the third resist 108. In this implantation process, the dose energy is 30 KeV and the dose density is $3.0 \times 10^{12}$ cm$^{-2}$.

Figure 13F:
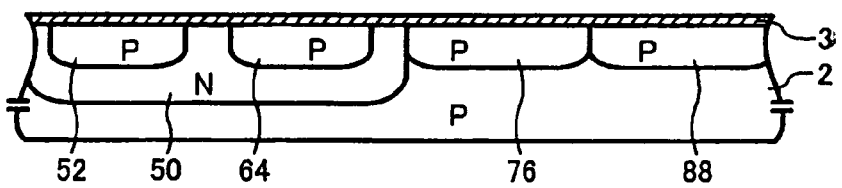

In step F of FIG. 13F, the third resist 108 is removed. Then, a heating process is performed to form the IPWs 52 and 64 in the DNW 50 and to form the P-wells 76 and 88 in areas other than the DNW 50. In this heating process, the temperature is 1150° C. and the heating process time is 2 hrs.

Figure 13G:
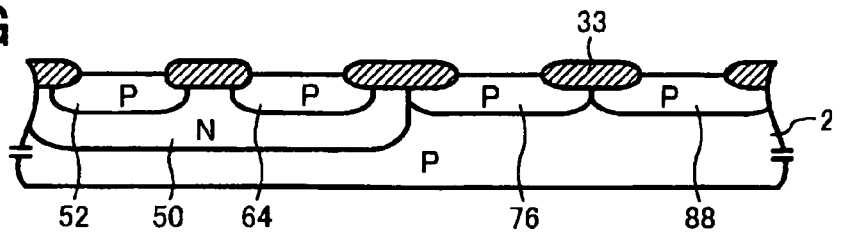

In step G of FIG. 13G, the silicon oxide 34 is removed. Then, the LOCOS oxides 33 are formed at predetermined areas by well known LOCOS forming process. After that, the gate oxides 60, 72, 84 and 96 and the gate electrodes 62, 74, 86 and 98, sources 54, 66, 78 and 90 and drains 56, 68, 80 and 96 are formed. As a result, N-ch transistors are formed in the substrate 2 as shown in FIG. 12.

According to this exemplary embodiment, the IPWs 52 and 64 can be used as a triple-well because the IPW 52 and 64 are electrically separated from the substrate 2 by the DNW 50. Further, this process contributes a large cost reduction because of no usage of the high energy implantation to form the triple-well structure.

In this exemplary embodiment, at the step C of FIG. 13C, the boron is implanted into the second well forming area 104 and the fourth well forming area 110 to make the P-type impurity density at the surface region of the DNW 50 substantially equal to the density of the substrate 2. Then, at the step D of FIG. 13D, the boron is implanted to both the second well forming area 104 and the third well forming areas 106 at a process such that the two combinations of the IPW 52 and the P-well 76 and the IPW 64 and the P-well 88 which have substantially equal surface densities respectively can be formed inside and outside of the DNW 50. It is possible to handle both combinations of MOS transistors (i.e., the MOS transistors 42 and 46 and the MOS transistors 44 and 48) as a single sort of device respectively during the circuit design. Therefore, the design activity can be simple and easy.

An additional photo-lithography process to form the neutering mask 114 for the boron implantation which neuters the phosphorus in the surface region of the second and fourth well forming areas 104 and 110 is utilized in comparison to the process flow of FIG. 7. However, when at least two IPWs are formed in the DNW and the P-well which is substantially equal to the IPW is formed in an area other than the DNW, one mask is utilized to form a set of wells which have substantially equal P-type impurity densities. In summary, one additional photo-lithography process to form the wells can be eliminated in comparison with the case using the existing process which utilizes an equal number of masks to the number of wells to be formed.

A separation area between the second well forming area 104 and the fourth well forming area 110 is remained to be N-type because the boron is implanted only to the second well forming area 104 and the fourth well forming area 110 and the separated area is not neutered. The IPWs 52 and 64 are electrically separated with the separation area. Then, the IPWs 52 and 64 can be closely located.

Figure 14:
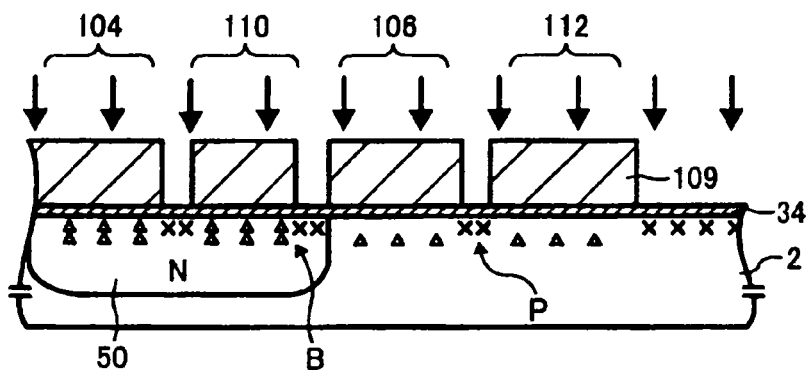
FIG. 14 illustrates a cross-sectional view of an optional process to FIG. 13.

The semiconductor device which is a similar device shown in FIG. 8 can be formed adding the process step E2 of FIG. 14 to the step E of FIG. 13E. At the process step E2 of FIG. 14, the fourth resist film 109 is formed on the silicon oxide 34. The fourth resist film 109 includes openings at positions corresponding to the separation areas. (i.e., an area between the fourth well forming area 110 and the third well forming area 106, an area between the third well forming area 106 and the fifth well forming area 112 and areas which are other than the above mentioned separation areas and the P-well. The phosphorus is implanted by masking with the fourth resist film 109.

After that, the phosphorus is implanted into the well forming areas by masking with the fourth resist film 109. The N-well 51a, 51b and 51c are formed at a process of forming the IPWs 52 and 64 and the P-wells 76 and 88 after the following heating process at the Step F of FIG. 13F is performed.

In this process, the phosphorus to form the N-wells 51a, 51b and 51c is implanted after the boron implantation for the formation of the IPWs 52 and 64 and P-wells 76 and 88. The N-type impurity density of the N-well 51d is higher than that of case of FIG. 8 because no boron is implanted for neutering.

Figure 15:
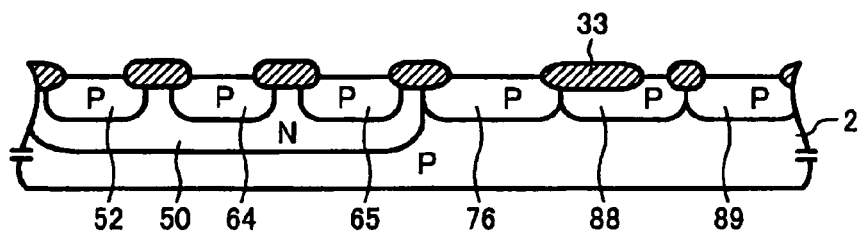
FIG. 15 illustrates a cross-sectional view of another exemplary embodiment of a semiconductor device.

FIG. 15 illustrates a cross-sectional view of another exemplary embodiment of a semiconductor device which includes three IPWs 52, 64 and 65. The IPWs 52, 64 and 65 are formed in the DWN 50 and P-wells 76, 88 and 89 are formed in an area other than the DNW 50. The IPWs 52, 64 and 65 are arranged with separation areas and are electrically separated from each other. Each well of the well combinations (i.e., the IPW 52 and P-well 76, the IPW 64 and P-well 88, the IPW 65 and P-well 89,) have substantially equal boron density of the surface region respectively.

Figure 16:
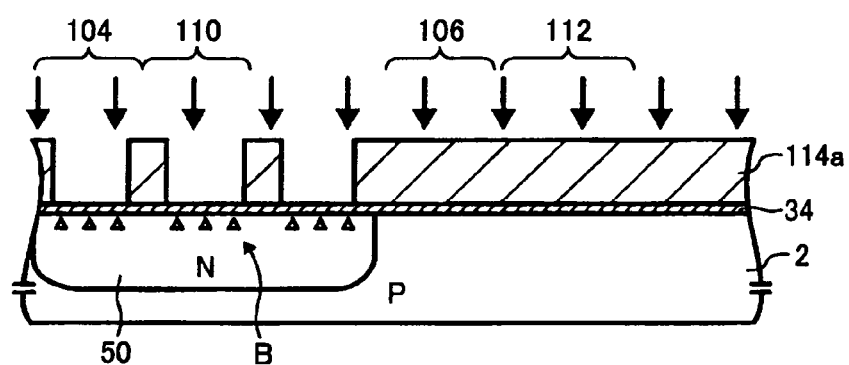
FIG. 16 illustrates a cross-sectional view of an optional process to FIG. 13.

The semiconductor device of this exemplary embodiment can be formed adding the process shown in FIG. 16 to the process of FIG. 13D. In addition to the second well forming area 104 and fourth well forming area 110 in the DNW 50 formed at the process step D of FIG. 13D, a neutering resist film 114a which includes openings at positions corresponding to areas other than the second well forming area 104 and fourth well forming area 110 is formed.

Figure 17:
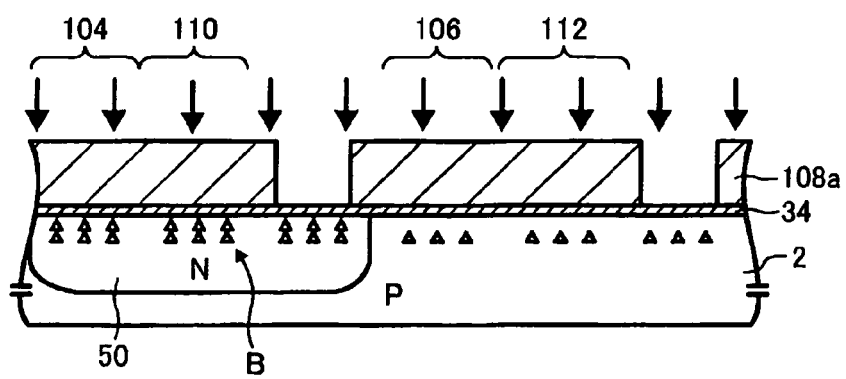
FIG. 17 illustrates a cross-sectional view of another optional process to FIG. 13.

The boron is implanted by masking with the neutering resist film 114a to make substantially equal to a density of the substrate 2 by neutering the phosphorus density at the surface region of the well forming areas. AS shown in FIG. 17, a resist 108a which includes openings at positions corresponding to areas other than the second well forming area 104 and fourth well forming area 110 and the third well forming area and fifth well forming area is formed after step E of FIG. 13E. The boron is implanted by masking with the resist film 108a. Thus, the semiconductor device shown in FIG. 15 is formed.

The LOCOS oxides 33 are formed after forming IPWs 52 and 64 and the P-wells 76 and 88 in the process of FIG. 13A to 13H. However, an optional process is possible that the LOCOS oxides 33 is formed before the neutering process of the boron implantation. The process will be described using FIGS. 18A to 18H.

Figure 18A:
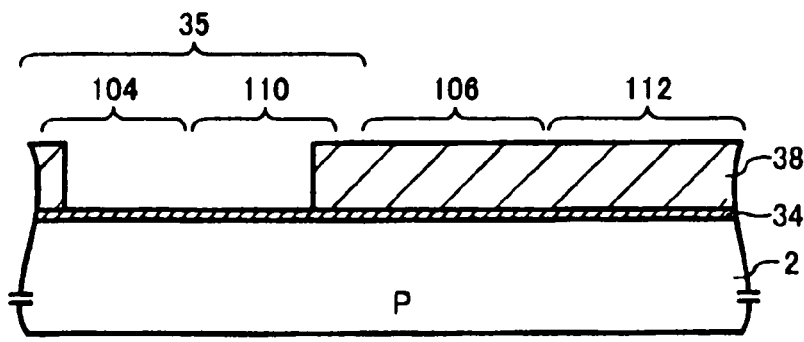
FIGS. 18A to 18H illustrate a semiconductor device in cross-section at each process according to another exemplary embodiment.

In step A of FIG. 18A, a silicon oxide 34 and a first resist film 38 are formed on the substrate 2 similarly to the process step A of FIG. 13A.

Figure 18B:
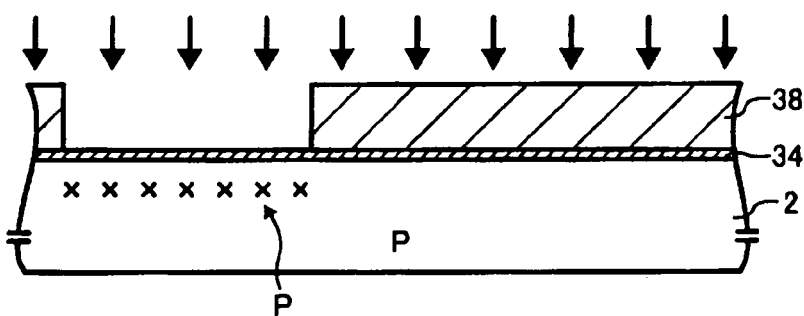

In step B of FIG. 18B, the phosphorus which is a N-type impurity is implanted similarly to the process step B of FIG. 13B.

Figure 18C:
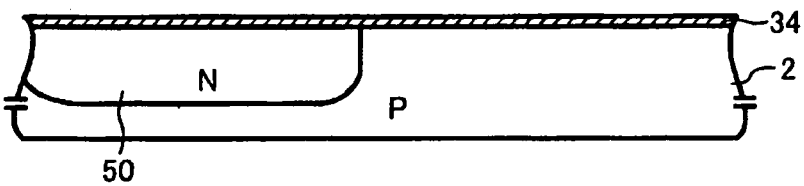

In step C of FIG. 18C, the first resist film 38 is removed. Heating process is performed to form the DNW 50 in the first well forming areas 35. In this heating process, the temperature is 1180° C. and the heating process time is 5 hrs.

Figure 18D:
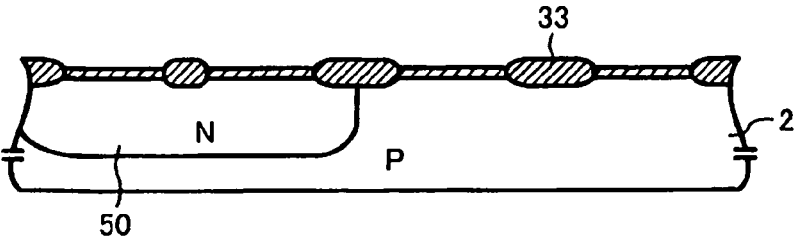

In step D of FIG. 18D, the silicon oxide 34 is removed. The LOCOS oxides 33 are formed at predetermined areas by well known LOCOS forming process.

Figure 18E:
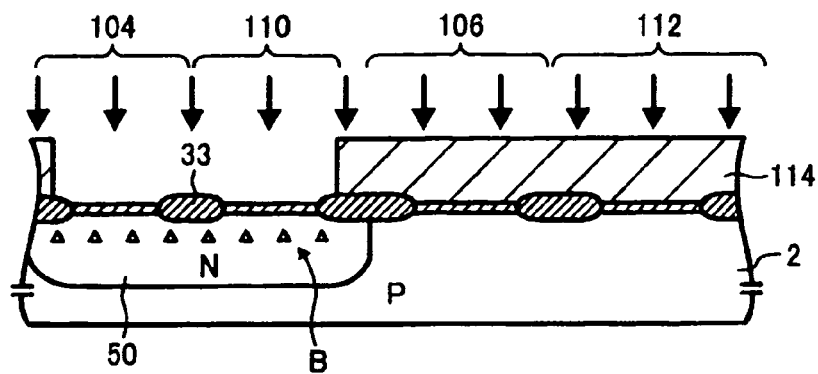

In step E of FIG. 18E, a neutering mask 114 having openings at positions corresponding to the second well forming area 104 and the fourth well forming area 110 is formed above the substrate 2 and the LOCOS oxides 33. The boron which is a P-type impurity is implanted into the second well forming area 104 and the fourth well forming area 110 by masking with the neutering mask 114. In this implantation process, the dose energy is 180 KeV and the dose density is $5.7 \times 10^{12}$ cm$^{-2}$.

Figure 18F:
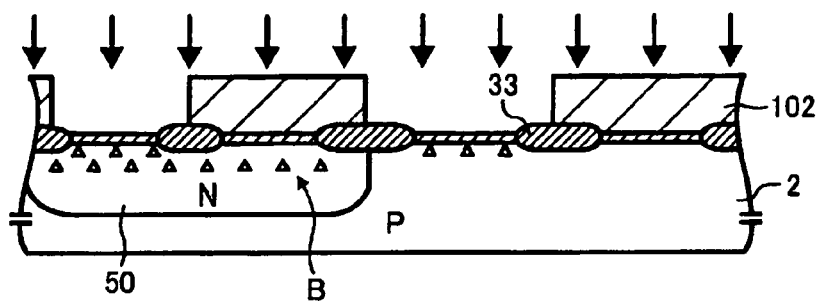
Figure 18G:
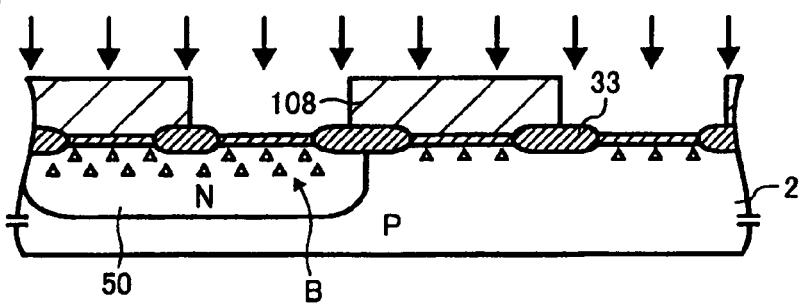
Figure 18H:
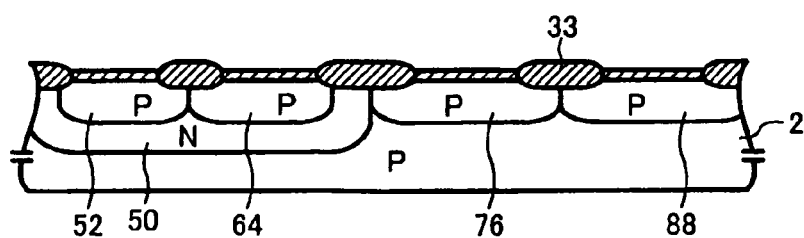

In step F of FIG. 18F, a second resist 102 having openings at positions corresponding to the second well forming area 104 and the third well forming area 106 is formed above the substrate 2 and the LOCOS oxides 33. The boron is implanted into the second well forming area 104 and the third well forming area 106 by masking with the second resist film 102. In this implantation process, the dose energy is 180 KeV and the dose density is $1.2 \times 10^{12}$ cm$^{-2}$.

In step G of FIG. 13G, the second resist film 102 is removed. A third resist 108 having openings at positions corresponding to the fourth well forming area 110 and the fifth well forming area 112 is formed. The boron is implanted into the fourth well forming area 110 and the fifth well forming area 112 by masking with the third resist 108. In this implantation process, the dose energy is 180 KeV and the dose density is $3.0 \times 10^{12}$ cm$^{-2}$.

In step F of FIG. 13F, the third resist 108 is removed. Then, a heating process is performed to form the IPWs 52 and 64 in the DNW 50 and to form the P-wells 76 and 88 in areas other than the DNW 50. In this heating process, the temperature is 1150° C. and the heating process time is 2 hrs.

According to the exemplary embodiment, it is possible to avoid absorption of the boron to the LOCOS oxide because the boron is implanted after the LOCOS formation. Moreover, the LOCOS oxides 33 can be formed at predetermined areas before the neutering process of the boron implantation to the surface regions of the second well forming area 104 and the fourth well forming area 110. As a result, it is possible to form a plurality of the well sets which have structures with substantially equal P-type impurity density without using of an expensive high energy ion implantation apparatus.

Figure 19:
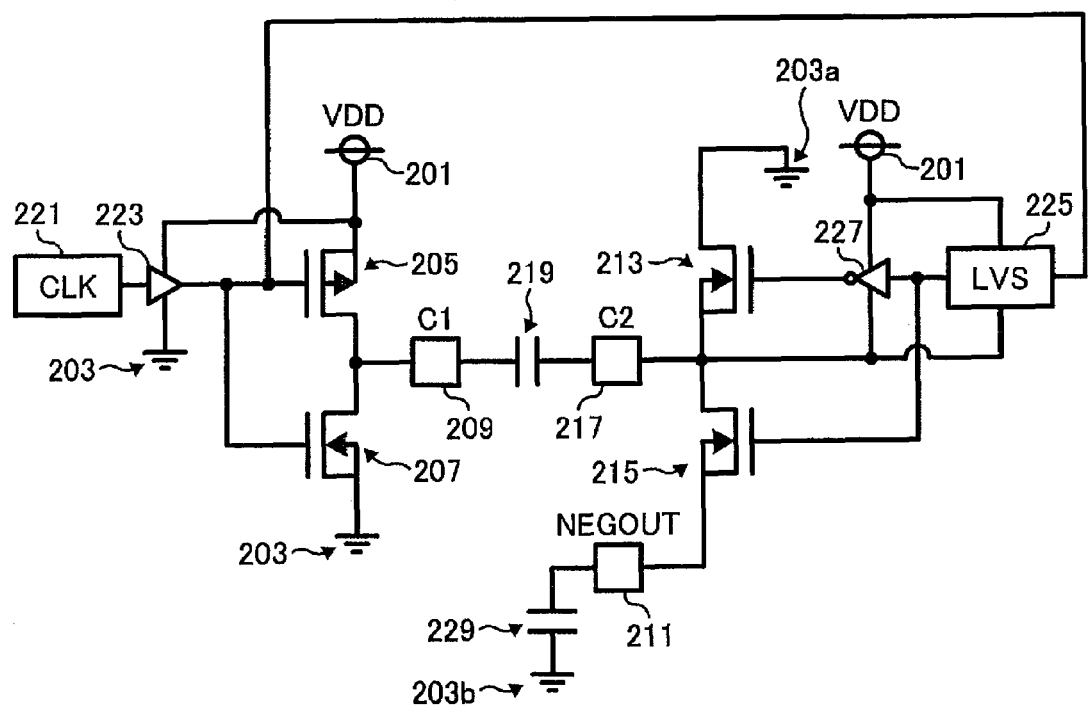
FIG. 19 illustrates an exemplary circuit which use the semiconductor device fabricated according to the exemplary embodiment.

The semiconductor device fabricated by the process according to the exemplary embodiment is used in a circuit as shown in FIG. 19. The circuit is an exemplary circuit of an inverting charge-pump type DC/DC converter. (converter) In the converter, a P-ch transistor 205 and a N-ch transistor 207 are arranged between a power supply terminal (VDD) 201 and a ground terminal (GND) 203. The transistors 205 and 207 work as a switching circuit.

A plus terminal 209 of a pump capacity c1 is connected to the interconnection of the P-ch transistor 205 and the N-ch transistor 207. N-ch transistors 213 and 215 are connected between another ground terminal 203a and an output terminal NEGOUT. The N-ch transistors 213 and 215 work as a switching circuit and are formed in the triple-well which is explained in the embodiment. A minus terminal 217 of a pump capacity c1 is connected to the interconnection of the N-ch transistors 213 and 215. An external capacitor 219 is connected between the plus and minus terminals 209 and 217.

An oscillation circuit (CLK) 221 and a buffer circuit 223 which alternate the interconnection of the transistors 205 and 207 between a voltage (VDD voltage) equal to the power supply voltage and a voltage (GND voltage) equal to the GND voltage are connected. The output of the buffer circuit 223 is connected to gates of the P-ch transistor 205 and the N-ch transistor 207 and a level-shift circuit (LVS) 225.

The level-shift circuit 225 oscillates between a potential VDD and a potential −VDD in accordance with an oscillation signal generated from the signal of the oscillation circuit 221. The output of the level-shift circuit 225 is connected to the gate of the N-ch transistor 215 and is connected to the gate of the N-ch transistor 213 via a inverter 227. The inverter 227 is formed in the triple-well which is explained in the embodiment. An external capacitor 229 is connected between the output terminal NEGOUT 211 and another ground terminal 203b.

Voltages are applied to the gates of the four transistors 205, 207, 213 and 215 of the converter through the oscillator 221. The pump capacity c1 between the plus and minus terminals 209 and 217 is charged and discharged. A minus voltage −VDD which has a reverse voltage of the power supply terminal VDD is output from the output terminal NEGOUT 211.

When a voltage of GND level potential is output from the buffer circuit 223 in accordance of the oscillation signal from the oscillation circuit 221, the P-ch transistor 205 and the N-ch transistor 213 are turned on and the other N-ch transistors 207 and 215 are turned off. The external capacitor 219 connected between the plus and minus terminals 209 and 217 is charged.

When a voltage of VDD level potential is output from the buffer circuit 223 in accordance of the oscillation signal from the oscillation circuit 221, the P-ch transistor 205 and the N-ch transistor 213 are turned off and the other N-ch transistors 207 and 215 are turned on. The charge stored in the external capacitor 219 connected between the plus and minus terminals 209 and 217 is discharged. The minus voltage −VDD which has a reverse voltage of the power supply terminal VDD is output from the output terminal NEGOUT 211. A minus current by the minus voltage −VDD keeps following by the repetition of these operation.

The triple-well structure formed according to the disclosure of the exemplary embodiment can be used in the circuit shown in FIG. 19. The teaching of this process forming triple-well can be applied to any semiconductor devices which need the triple-well structure.

In the exemplary embodiments, the N-type DNWs and P-type IPWs are formed on the P-type substrate 2. It is possible that the INW are formed in the P-type DPWs formed on the N-type substrate.

Numerous additional modifications and variations are possible in light of the above teachings. It is therefore to be understood that within the scope of the appended claims, the disclosure of this patent specification may be practiced otherwise than as specifically described herein. For example, elements and/or features of different illustrative embodiments may be combined with each other and/or substituted for each other within the scope of this disclosure and appended claims.

This patent specification is based on Japanese patent application, No. 2005-081055 filed on Mar. 22, 2005 in the Japan Patent Office, the entire contents of which are incorporated by reference herein.

What is claimed is:

1. A method for fabricating semiconductor device having a plurality of well structures including a triple-well structure, comprising the steps of:
    forming a thermally stable film on a first conductivity type substrate;

forming a first resist film having an opening at a position corresponding to a first well forming area on the thermally stable film;
removing the thermally stable film selectively by masking with the first resist film so as to make a neutering mask;
implanting second conductivity type impurity into the first well forming area by masking with the neutering mask and the first resist film;
removing the first resist film;
forming a first well having a second conductivity type by diffusing and activating the second conductivity type impurity implanted into the first well forming area with a heating process;
implanting first conductivity type impurity into a surface region of the first well forming area by masking with the neutering mask to neutralize the second conductivity type impurity implanted;
removing the neutering mask;
forming a second resist film having openings at a position corresponding to the second well forming area in the neutralized area and at a position corresponding to a third well forming area which is located in an area other than the first well forming area on the substrate;
implanting additional impurity of the first conductivity type into the second and the third well forming area by masking with the second resist film;
removing the second resist film; and
forming a second well at the second well forming area and a third well at the third well forming area by diffusing and activating the additional impurity of the first conductivity type implanted into the second and the third well forming areas with a heating process.

2. The method of claim 1, further comprising the steps of:
(x) forming a third resist film having openings at a position corresponding to a fourth well forming area in the neutered area and at a position corresponding to a fifth well forming area which is located in an area other than the first well forming area on the substrate, the fourth well forming area being an area where the first conductivity type impurity is not implanted;
(y) implanting a first conductivity type impurity into the fourth and the fifth well forming area by masking with the third resist film; and
(z) removing the third resist film.

3. The method of claim 2, wherein steps (x) (y) and (z) are performed at least twice.

4. The method of claim 1, further comprising the steps of:
forming a fourth resist film having openings at a position corresponding to a sixth well forming area which is located in an area other than the area of the first conductivity type;
implanting additional impurity of the second conductivity type into the sixth well forming area by masking with the fourth resist film; and
removing the fourth resist film.

5. The method of claim 4, wherein at least one of the sixth well forming areas is located in a separation area between wells of the first conductivity type.

6. The method of claim 1, wherein the thermally stable film is made of silicon nitride.

7. The method of claim 6, wherein the silicon nitride film is formed on a silicon oxide.

8. A method for fabricating semiconductor device having a plurality of well structures including a triple-well structure, comprising the steps of:

forming a first resist film having an opening at a position corresponding to a first well forming area on a first conductivity type substrate;
implanting second conductivity type impurity into the first well forming area by masking with the first resist film;
removing the first resist film;
forming a first well having a second conductivity type well by diffusing and activating the second conductivity type impurity implanted into the first well forming area with a heating process;
forming a neutering resist mask having openings at a position corresponding to at least two of the first well forming areas in the first conductivity type well;
implanting additional impurity of the second conductivity type into the first well forming area by masking with the neutering resist mask and the first resist film;
removing the neutering resist mask;
forming a second resist film having openings at a position corresponding to a second well forming area in the first well and at a position corresponding to a third well forming area which is located in an area other than the first well forming area on the substrate;
implanting first conductivity type impurity into the second and third well forming areas by masking with the second resist film;
removing the second resist film;
forming a third resist film having openings at a position corresponding to a fourth well forming area in the first well and a position corresponding to a fifth well forming area which is located in an area other than the first well forming area on the substrate, the fourth and fifth well forming areas being areas where the first conductivity type impurity is not implanted;
implanting additional impurity of the first conductivity type into the fourth and fifth well forming areas by masking with the third resist film;
removing the third resist film; and
forming a second well and a fourth well in the first well forming area and a third well and a fifth well in an area other than the first well forming area by diffusing and activating the first conductivity type impurity implanted into the first well forming area with a heating process.

9. The method of claim 8, further comprising the steps of:
forming an extra-well resist film having openings at other position from the fourth well forming area in the first well and at other position to the fifth well forming area which is located in an area other than the first well forming area on the substrate; and
implanting first conductivity type impurity by masking with the extra-well resist film.

10. The method of claim 8, further comprising the steps of:
forming a fourth resist film having openings at a position corresponding to a sixth well forming area which is located in an area other than the area of first conductivity type;
implanting the second conductivity type impurity into the sixth well forming area by masking with the fourth resist film; and
removing the fourth resist film.

11. The method of claim 10, wherein the sixth well forming area includes at least one separation area between the first conductivity type well forming areas.

12. The method of claim 10, wherein the second conductivity type is N-type and the first conductivity type impurity is boron.

13. The method of claim 8, wherein the LOCOS oxide is formed at a predetermined area after forming the first well.

14. A semiconductor device comprising:
a substrate having a first conductivity type;
a first well having a second conductivity type formed on the substrate;
a second well having the first type conductivity formed in the first well; and
a third well having the first conductivity type formed in an area other than the first well,
wherein the first, second and third wells are formed by the method of claim 1.

* * * * *